US009296010B2

United States Patent
Watanabe et al.

(10) Patent No.: US 9,296,010 B2
(45) Date of Patent: Mar. 29, 2016

(54) COATING FILM FORMING APPARATUS

(71) Applicant: Tokyo Electron Limited, Tokyo (JP)

(72) Inventors: Shinjiro Watanabe, Nirasaki (JP); Michikazu Nakamura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/458,408

(22) Filed: Aug. 13, 2014

(65) Prior Publication Data

US 2015/0059644 A1    Mar. 5, 2015

(30) Foreign Application Priority Data

Aug. 30, 2013  (JP) ................................. 2013-179447
Jun. 5, 2014   (JP) ................................. 2014-116969

(51) Int. Cl.
| B05C 5/00 | (2006.01) |
| B05C 11/10 | (2006.01) |
| B05B 13/02 | (2006.01) |
| B05B 1/30 | (2006.01) |
| B05C 5/02 | (2006.01) |
| B05C 13/00 | (2006.01) |
| H01L 21/67 | (2006.01) |

(52) U.S. Cl.
CPC ........... *B05C 11/1021* (2013.01); *B05B 1/3006* (2013.01); *B05C 5/0208* (2013.01); *B05C 5/0225* (2013.01); *B05C 13/00* (2013.01); *H01L 21/6715* (2013.01)

(58) Field of Classification Search
USPC ........... 118/300, 305, 319, 320, 52, 612, 663, 118/692, 695, 696, 712; 427/240; 239/568, 239/601; 396/604, 611, 627
See application file for complete search history.

(56) References Cited

FOREIGN PATENT DOCUMENTS

| JP | 08-138998 A |   | 5/1996 |
| JP | 2001062368 A | * | 3/2001 |
| JP | 2004-114012 A |   | 4/2004 |
| JP | 2013-098371 A |   | 5/2013 |

OTHER PUBLICATIONS

English Translation JP2001062368A, Mar. 13, 2001.*

* cited by examiner

*Primary Examiner* — Yewebdar Tadesse
(74) *Attorney, Agent, or Firm* — Posz Law Group, PLC

(57) ABSTRACT

A coating film forming apparatus includes: a coating nozzle; a horizontal moving mechanism that relatively moves a substrate and the coating nozzle; a pressure regulating mechanism that regulates a pressure inside the coating nozzle; and a controller that changes an amount of the coating solution to be supplied from the coating nozzle, wherein the coating nozzle includes: a discharge port that is formed long in a direction perpendicular to a direction of the relative movement with respect to the substrate; and a storage chamber that communicates with the discharge port and stores the coating solution therein, and wherein while the coating solution is applied to the substrate, the pressure regulating mechanism is controlled according to a change in width of the substrate, to regulate the pressure inside the storage chamber to thereby change a discharge amount per unit time of the coating solution to be discharged.

5 Claims, 8 Drawing Sheets

COATING FILM FORMING APPARATUS

CROSS REFERENCE TO RELATED APPLICATIONS

This application is based upon and claims the benefit of priority of the prior Japanese Patent Application No. 2013-179447, filed in Japan on Aug. 30, 2013, and the prior Japanese Patent Application No. 2014-116969, filed in Japan on Jun. 5, 2014, the entire contents of which are incorporated herein by reference.

BACKGROUND OF THE INVENTION

1. Field of the Invention

The present invention relates to a coating film forming apparatus for forming a coating film on a substrate such as a semiconductor wafer.

2. Description of the Related Art

In a manufacturing process for a semiconductor device, a liquid crystal display device and an LED, a step is performed which forms a coating film by applying a coating solution such as a resist solution, a conductive paste onto a substrate.

As a method of forming the coating film on the substrate, there is a known spin-coat method of dripping the coating solution from a nozzle to a central portion of the substrate with the substrate is being rotated and diffusing the coating solution on the substrate by the centrifugal force. However, in the spin-coat method, the dripped coating solution is applied and spread by the centrifugal force and therefore the most of the coating solution is scattered from an outer peripheral edge portion of the substrate and is discarded. Accordingly, the spin-coat method is a method not adequate to the case of forming the coating film using, for example, an expensive material such as a conductive paste containing rare metal fine particles.

As another method of forming the coating film on the substrate, there is a known slit-coat method of forming the coating film by relatively moving a nozzle and a substrate with a solution puddle formed between a nozzle having an elongated discharge port in a slit shape and a substrate (FIG. 1 of Japanese Laid-Open Patent Publication No. 2004-114012, FIG. 3 of Japanese Laid-Open Patent Publication No. H8-138998).

However, the coating film formed by the slit-coat method has a problem of being likely to be uneven in film thickness within the substrate. Hence, it is suggested to regulate the pressure inside a storage chamber that stores the coating solution in the nozzle so as to make the discharge amount of the coating solution from the discharge port constant in a coating film forming apparatus by the slit-coat method (What is claimed is of Japanese Laid-Open Patent Publication No. 2013-98371).

In the slit-coat method, the coating solution is discharged utilizing the own weight of the coating solution in the nozzle and the decrease in surface tension of the coating solution by the coating solution exposed to the discharge port of the nozzle adhering to the substrate. From the principle, the coating film formation by the slit-coat method is performed under assumption of treating a substrate having a width equal to or smaller than the length of the elongated discharge port. Further, in the slit-coat method, the discharge width of the coating solution to be applied onto the substrate is almost equal to the width of the substrate. Note that the width of the substrate means the length in a direction perpendicular to the relative movement of the nozzle and the substrate.

The width of the substrate is constant, for example, in a rectangular glass substrate for FPD. However, for example, in the semiconductor wafer forming a circle, the width of the substrate gradually changes in a process of relatively moving the nozzle and the substrate. As described above, in the slit-coat method, the discharge width of the coating solution to be applied onto the substrate is almost equal to the width of the substrate. Accordingly, when the width of the substrate changes, the discharge width of the coating solution also changes. Therefore, when the discharge pressure inside the nozzle is constant, the coating solution to be discharged from the discharge port tends to be insufficient in a process of the width of the substrate increasing, conversely, the coating solution to be discharged from the discharge port tends to be excessive in a process of the width of the substrate decreasing, during the coating. This results in a problem in which in the case of treating the substrate changing in width such as a semiconductor wafer, the film thickness is small in the first half of the coating and is large in the second half of the coating near the center of one substrate as a boundary, causing a difference in film thickness of the toting film within the substrate.

SUMMARY OF THE INVENTION

The present invention forms a uniform coating film on a substrate in a shape changing in width in a coating film formation by a slit-coat method.

A coating film forming apparatus of the present invention may include: a coating nozzle that supplies a coating solution toward a substrate; a horizontal moving mechanism unit that relatively moves the substrate and the coating nozzle in a horizontal direction; a pressure regulating mechanism unit that regulates a pressure inside the coating nozzle; and a control unit that performs control to change an amount of the coating solution to be supplied from the coating nozzle toward the substrate. In the coating film forming apparatus of the present invention, the substrate may form a shape changing in width in a direction perpendicular to a direction of the relative movement, and the coating nozzle may include: a discharge port that is formed long in a direction perpendicular to the direction of the relative movement with respect to the substrate and discharges the coating solution toward the substrate; and a storage chamber that communicates with the discharge port and stores the coating solution therein.

In the coating film forming apparatus of the present invention, the pressure regulating mechanism unit regulates a pressure of a space inside the storage chamber, and the control unit controls, while the coating solution is applied to the substrate, the pressure regulating mechanism unit, according to a discharge width of the coating solution to be discharged from the discharge port changing responding to a change in width of the substrate, to regulate the pressure inside the storage chamber to thereby change a discharge amount per unit time of the coating solution to be discharged from the discharge port.

According to the present invention, it is possible to form a uniform coating film on a substrate in a shape changing in width in a coating film formation by a slit-coat method.

DETAILED DESCRIPTION OF THE INVENTION

Figure 1:
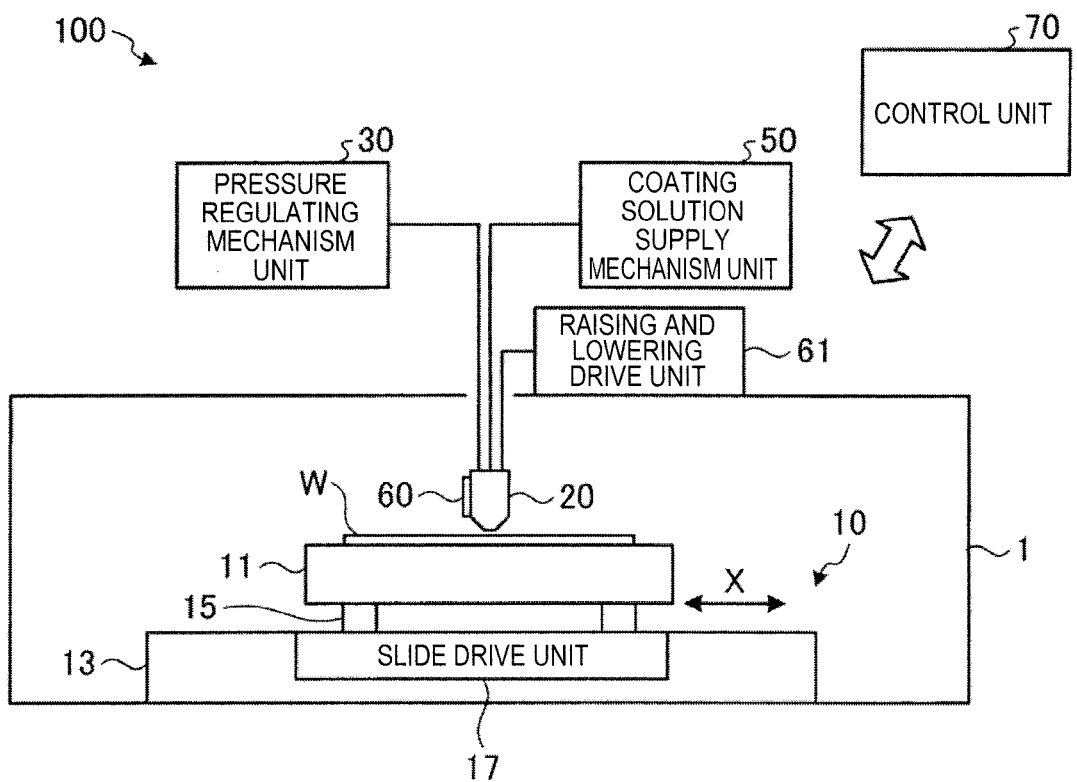
FIG. 1 is a view illustrating a schematic configuration of a coating film forming apparatus according to an embodiment of the present invention.

Hereinafter, an embodiment of the present invention will be described referring to the drawings.

<Outline of Coating Film Forming Apparatus>

First, a configuration example of a coating film forming apparatus according to an embodiment of the present invention will be described. FIG. 1 is a longitudinal sectional view illustrating a schematic configuration of a coating film forming apparatus 100 according to this embodiment. The coating film forming apparatus 100 includes a treatment container 1, a support device 10 that horizontally supports a semiconductor wafer (hereinafter, referred to simply as a "wafer") W being a treatment object, and a coating nozzle 20 that applies a coating solution to the wafer W supported by the support device 10. The coating film forming apparatus 100 further includes a pressure regulating mechanism unit 30 that regulates the pressure inside the coating nozzle 20, a coating solution supply mechanism unit 50 that supplies the coating solution to the coating nozzle 20, a sensor unit 60 that detects relative positions of the coating nozzle 20 and the wafer W, and a raising and lowering drive unit 61 that displaces the coating nozzle 20 in the vertical direction. The coating film forming apparatus 100 further includes a control unit 70 that controls the components in the coating film forming apparatus 100.

(Treatment Container)

The treatment container 1 has a box shape and formed of, for example, metal such as aluminum or a material such as a synthetic resin. A side surface of the treatment container 1 is formed with a transfer-in/out port for the wafer W though illustration thereof is omitted. Note that the treatment container 1 has an arbitrary configuration or can be omitted.

(Support Device)

The support device 10 includes a stage 11 on which the wafer W is mounted, a base unit 13 that supports the stage 11, a coupling unit 15 that couples the stage 11 and the base unit 13, and a slide drive unit 17 that drives the stage 11 in the horizontal direction. The stage 11 is configured to be slidable in an X-direction indicated with a black arrow in FIG. 1 and in a Y-direction perpendicular to the X-direction (namely, perpendicular to the plane of paper of FIG. 1) by the slide drive unit 17 being a horizontal drive mechanism unit. More specifically, the stage 11 is provided to be relatively movable with respect to the coating nozzle 20 at rest, while mounting the wafer W thereon.

(Coating Nozzle)

Figure 2:
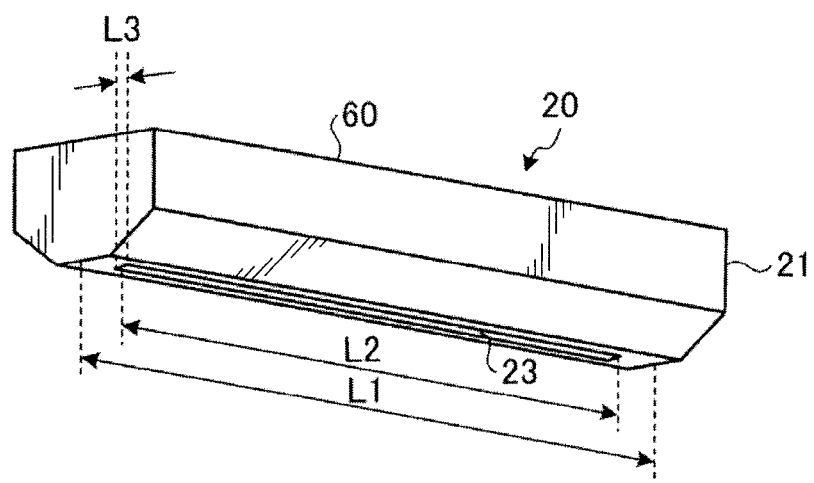
FIG. 2 is a perspective view illustrating a schematic configuration of a coating nozzle.
Figure 3:
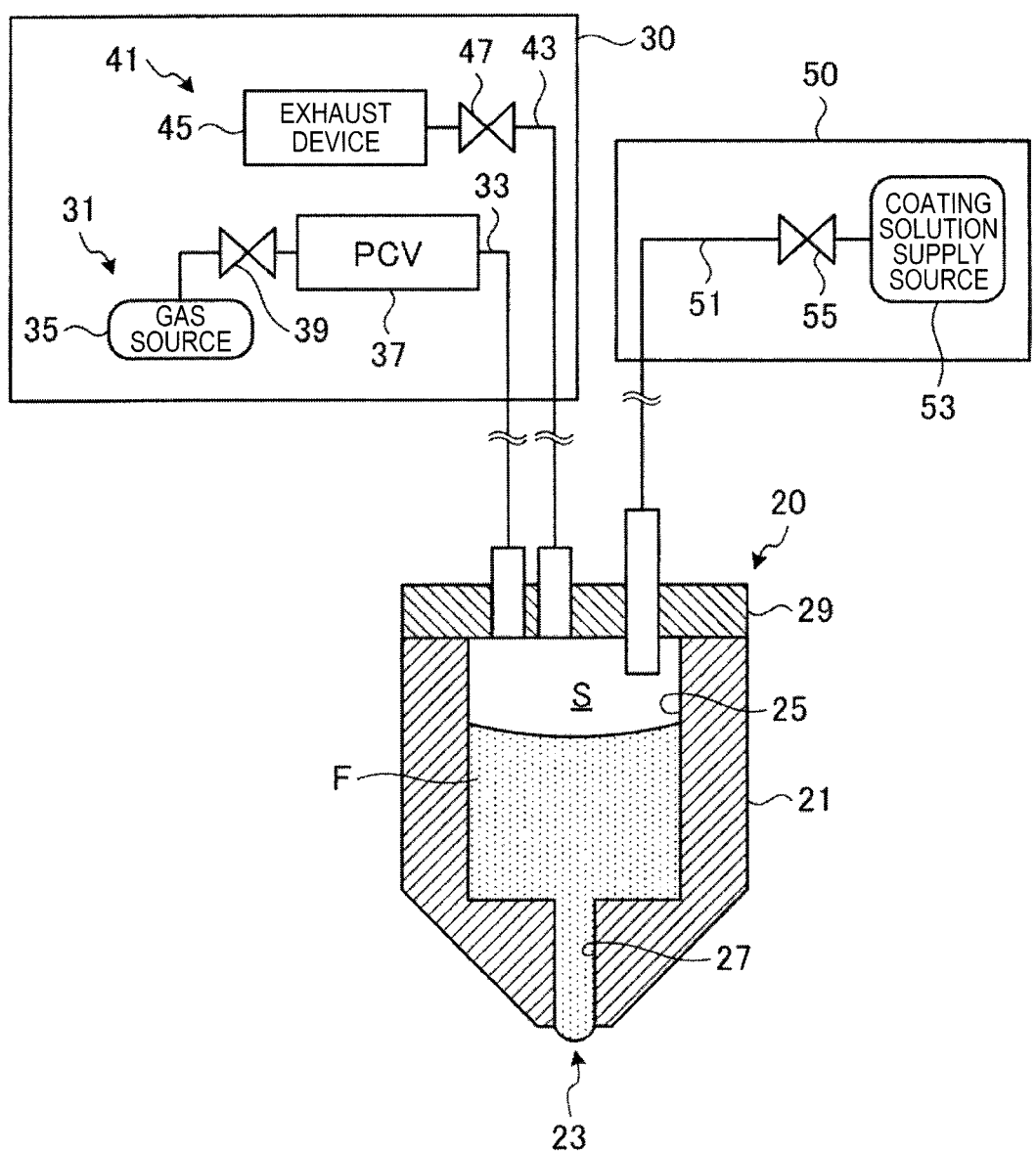
FIG. 3 is a cross-sectional view of the coating nozzle in a direction perpendicular to the longitudinal direction thereof.

The coating nozzle 20 has an elongated shape long and thin as a whole. FIG. 2 is a perspective view illustrating an external appearance of the coating nozzle 20. FIG. 3 illustrates a cross-sectional shape of the coating nozzle 20 in the direction perpendicular to the longitudinal direction thereof. The coating nozzle 20 has a main body 21, and a discharge port 23 in a slit shape formed at a lower end of the main body 21. The main body 21 has a length L1 formed larger than at least the diameter of the wafer W. A lower end surface of the main body 21 is formed with a discharge port 23 having a length L2, for example, larger than the diameter of the wafer W along the longitudinal direction of the main body 21.

Inside the main body 21, a storage chamber 25 that stores a coating solution F is formed along the longitudinal direction of the main body 21. The storage chamber 25 temporarily stores a predetermined volume of the coating solution F. The length of the storage chamber 25 is the same as the length L2 of the discharge port 23. The capacity of the storage chamber 25 and the amount of the coating solution F to be stored therein only need to be equal to or more than an amount with which a coating film can be formed at least once or more over the entire surface of one wafer W. At the lower portion of the storage chamber 25, a flow passage 27 communicating with the discharge port 23 is formed in the vertical direction. The width of the flow passage 27 is the same as a width L3 of the discharge port 23. Further, the length in the longitudinal direction of the flow passage 27 is the same as the length L2 of the discharge port 23.

As illustrated in FIG. 3, the coating solution F flowed down to the flow passage 27 due to its own weight from the storage chamber 25 stays to be sandwiched between the discharge port 23 and the flow passage 27. Here, the width L3 of the discharge port 23 is set to a value at which when the pressure inside the storage chamber 25 is made equal to the pressure outside the storage chamber 25, the surface tension of the coating solution F is smaller than the gravity acting on the coating solution F so that the coating solution F flows down from the discharge port 23. Note that the width L3 of the discharge port 23 is experimentally decided according to the viscosity of the coating solution F and the material of the main body 21.

At the upper end of the main body 21, a lid part 29 is provided in a manner to close the storage chamber 25. Further, in a region surrounded by the solution surface of the coating solution F stored in the storage chamber 25, the inner wall surface of the storage chamber 25, and the lid part 29, a hermetically closed space S is formed.

(Pressure Regulating Mechanism Unit)

In the coating film forming apparatus 100 of this embodiment, the pressure regulating mechanism unit 30 that controls the pressure inside the hermetically closed space S is connected to the storage chamber 25. The pressure regulating mechanism unit 30 includes a gas supply mechanism section 31 that supplies gas for pressure regulation into the storage chamber 25, and an exhaust mechanism section 41 that depressurizes and exhausts the storage chamber 25.

The gas supply mechanism section 31 includes, for example, a gas supply pipe 33 that communicates with the storage chamber 25 in a manner to penetrate the lid part 29, a gas source 35 that is connected to the other end side of the gas supply pipe 33 and stores gas, and valves such as a pressure regulating valve (PCV) 37 and an opening/closing valve 39 that are provided at the middle of the gas supply pipe 33. As the gas, for example, an inert gas such as a nitrogen gas is preferably used. Supplying the gas into the storage chamber 25 by the gas supply mechanism section 31 makes it possible to regulate the pressure of the space S in the storage chamber 25. Further, supplying the gas from the gas supply mechanism section 31 makes it possible to pressurize the coating solution F remaining in the storage chamber 25 after the discharge of the coating solution F and push away or purge the coating solution F. Note that if the coating solution F does not change in quality, a mechanism that introduces outside air into the storage chamber 25 may be provided in place of the gas supply mechanism section 31.

The exhaust mechanism section 41 includes, for example, an exhaust pipe 43 that communicates with the storage chamber 25 in a manner to penetrate the lid part 29, an exhaust device 45 such as a vacuum pump that is connected to the other end side of the exhaust pipe 43, and an opening/closing valve 47 that is provided at the middle of the exhaust pipe 43. The exhaust mechanism section 41 operates the exhaust device 45 to keep the inside of the space S in the storage chamber 25 at a predetermined negative pressure state. The exhaust mechanism section 41 exhausts the storage chamber 25 to make the pressure of the space S in the storage chamber 25 to a negative pressure with respect to the outside pressure so as to draw up the coating solution F in the storage chamber 25, thereby making it possible to prevent solution leakage of the coating solution F dripping from the discharge port 23.

(Coating Solution Supply Mechanism Unit)

To the storage chamber 25 in the coating nozzle 20, the coating solution supply mechanism unit 50 is connected which supplies the coating solution F into the storage chamber 25. The coating solution supply mechanism unit 50 includes, for example, a coating solution supply pipe 51 that communicates with the storage chamber 25 in a manner to penetrate the lid part 29, a coating solution supply source 53 that is connected to the other end side of the coating solution supply pipe 51 and stores the coating solution F, and valves such as an opening/closing valve 55 that is provided at the middle of coating solution supply pipe 51. Opening the opening/closing valve 55 provided in the coating solution supply pipe 51 in the state where the exhaust mechanism section 41 makes the pressure of the space S in the storage chamber 25 to the negative pressure with respect to the pressure outside the main body 21, makes it possible to draw the coating solution F stored in the coating solution supply source 53 into the storage chamber 25. Examples of the coating solution F include, for example, a resist solution, a conductive paste containing rare metal fine particles and so on.

(Sensor Unit)

The coating film forming apparatus 100 includes the sensor unit 60 as a position detection means that detects relative positions of the coating nozzle 20 and the wafer W. The sensor unit 60 is attached to the coating nozzle 20 and is relatively movable in the X- and Y-directions with respect to the stage 11 and the wafer W mounted thereon. The sensor unit 60 applies laser light to the stage 11 and the wafer W mounted thereon and detects its reflected light to thereby detect the relative positions of the coating nozzle 20 and the wafer W. More specifically, the sensor unit 60 detects positions of several portions (for example, four portions) of the edge portion of the wafer W to detect position coordinates of a central portion of the wafer W and the size of the wafer W, as an alignment processing just before a coating step. As the sensor unit 60, for example, an area sensor, a line sensor or the like can be used.

(Raising and Lowering Drive Unit)

The coating nozzle 20 is configured to be vertically displaced by the raising and lowering drive unit 61. The coating nozzle 20 can be switched between a waiting position where it is raised at an enough distance from the wafer W and a coating position where it is brought close to the wafer W so that the interval between an upper surface of the wafer W and the discharge port 23 falls within a range of, for example, 0 to 500 m. Note that instead of connecting the raising and lowering drive unit 61 to the coating nozzle 20 to vertically displace the coating nozzle 20, the raising and lowering drive unit may be connected to the stage 11 to vertically displace the stage 11.

(Control Unit)

End devices (for example, the support device 10, the coating nozzle 20, the pressure regulating mechanism unit 30, the coating solution supply mechanism unit 50, the sensor unit 60, the raising and lowering drive unit 61 and so on) constituting the coating film forming apparatus 100 are connected to and controlled by the control unit 70. Here, an example of a hardware configuration of the control unit 70 will be described referring to FIG. 4. The control unit 70 includes a main control unit 101, an input device 102 such as a keyboard, a mouse and the like, an output device 103 such as a printer and the like, a display device 104, a storage device 105, an external interface 106, and a bus 107 that connects them together. The main control unit 101 has a CPU (central processing unit) 111, a RAM (random access memory) 112, and a ROM (read only memory) 113. The storage device 105 has any form as long as it can store information, and is, for example, a hard disk drive or an optical disk device. Further, the storage device 105 is configured to record information on a computer-readable recording medium 115 and read information from the recording medium 115. The recording medium 115 has any form as long as it can store information, and is, for example, a hard disc, an optical disc, a flash memory or the like. The recording medium 115 may be a recording medium recording a recipe for a coating film forming method according to this embodiment.

In the control unit 70, the CPU 111 executes a program stored in the ROM 113 or the storage device 105 using the RAM 112 as a working area to thereby allow the coating film forming apparatus 100 in this embodiment to perform a coating film forming treatment on the wafer W. The storage device 105 saves, for example, control programs (software) for implementing various treatments performed in the coating film forming apparatus 100 by control of the control unit 70, and recipes in which treatment condition data and so on are recorded. Thus, an arbitrary control program or recipe is called as necessary from the storage device 105 under the instruction or the like from the input device 102 and then executed by the main control unit 101, whereby a predetermined coating film forming treatment is performed in the coating film forming apparatus 100 under the control of the main control unit 101.

Specifically, the control unit 70 instructs the above-described end devices to operate and stop under the conditions determined in a recipe. For example, the control unit 70 can send a control signal to the support device 10 to move the stage 11 in the X- and Y-directions to thereby position the wafer W. Further, the control unit 70 can move the stage 11 in the X-direction at a predetermined speed to relatively move the wafer W with respect to the coating nozzle 20. Further, the control unit 70 can send a control signal to the pressure regulating mechanism unit 30 to regulate the pressure of the space S in the storage chamber 25 of the coating nozzle 20 to a predetermined value.

The control program and the recipe of the treatment condition data and so on can be used by installing those stored, for example, into the computer-readable recording medium 115 to the storage device 105.

Figure 4:
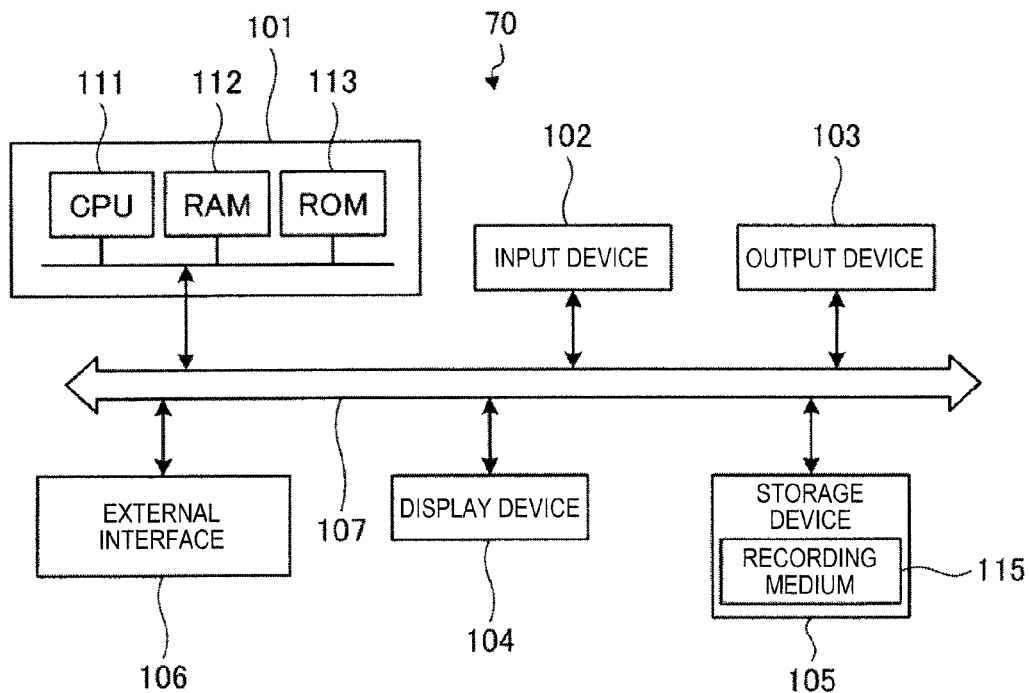
FIG. 4 is an explanatory view illustrating a hardware configuration of a control unit.
Figure 5:
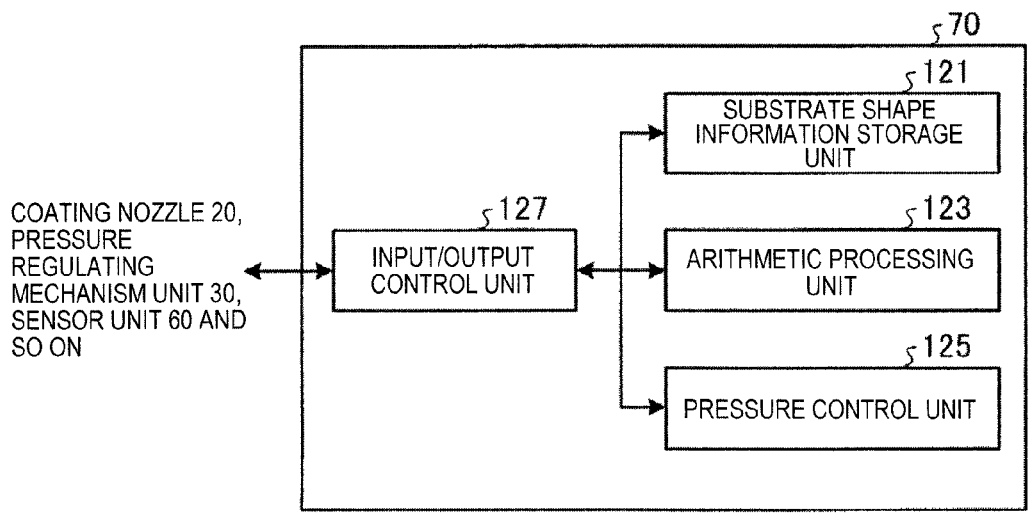
FIG. 5 is a functional block diagram illustrating a functional configuration of the control unit.

Next, a functional configuration of the control unit 70 will be described referring to FIG. 5. FIG. 5 is a functional block diagram illustrating the functional configuration of the control unit 70. Note that the numerals in FIG. 4 are also referred to in the following description, on the assumption that the hardware configuration of the control unit 70 is the configuration illustrated in FIG. 4. As illustrated in FIG. 5, the control unit 70 includes a substrate shape information storage unit 121, an arithmetic processing unit 123, a pressure control unit 125, and an input/output control unit 127. These are realized by the CPU 11 executing the program stored in the ROM 113 or the storage device 105 using the RAM 112 as a working area.

The substrate shape information storage unit 121 saves the substrate shape information inputted from the input device 102. Here, the substrate shape information means the planar shape, the diameter and so on of the substrate. For example, when the substrate is a wafer W, the fact that it is circular and its diameter are inputted. In the coating film forming apparatus 100 in this embodiment, for example, the ROM 113, the storage device 105, or the recording medium 115 can be made to function as the substrate shape information storage unit 121.

The arithmetic processing unit 123 calculates in real time a discharge width and a discharge amount of the coating solution F on the basis of the substrate shape information stored in the substrate shape information storage unit 121, and the information on the position coordinates and the size of the wafer W detected by the alignment processing by the sensor unit 60 as the position detection means and the position coordinates of the stage 11 at the point in time.

The pressure control unit 125 controls the pressure regulating mechanism unit 30 on the basis of the discharge width and the discharge amount of the coating solution F calculated by the arithmetic processing unit 123. Specifically, the pressure control unit 125 sends controls signals to the gas supply mechanism section 31 and/or the exhaust mechanism section 41 on the basis of the discharge width and the discharge amount of the coating solution F calculated by the arithmetic processing unit 123 to regulate the pressure of the space S in the storage chamber 25 to a value according to the discharge width of the coating solution F.

The input/output control unit 127 is configured to perform control of input from the input device 102, control of output to the output device 103, control of display on the display device 104, and control of input/output of data and so on from/to the outside performed via the external interface 106.

[Coating Film Forming Method]

Next, the coating film forming treatment performed in the coating film forming apparatus 100 configured as described above will be described. The treatment in the coating film forming apparatus 100 can include, for example, a step of transferring the wafer W into the treatment container 1 and holding the wafer W by the support device 10, and a coating step of applying the coating solution F to the wafer W while relatively moving the coating nozzle 20 and the wafer W mounted on the stage 11. Hereinafter, the steps will be described.

(Transfer in and Set Wafer)

First, with the not-illustrated transfer-in/out port of the treatment container 1 opened, the wafer W is transferred into the treatment container 1 by the not-illustrated external transfer device. On the stage 11 of the support device 10, a mounting part (not illustrated) is provided on which the wafer W is to be mounted, and the wafer W is set on the mounting part. Then, while the stage 11 is being moved in the X- and Y-directions, the alignment processing is performed by the sensor unit 60 just before the coating step to detect the position coordinates of the central portion of the wafer W and the size of the wafer W.

(Coating Step)

Next, the coating nozzle 20 is set at a predetermined height position. The coating nozzle 20 is fixed at a position outside the end portion of the wafer W on the stage 11. In this event, the inside of the storage chamber 25 of the coating nozzle 25 has been preliminarily regulated to have a negative pressure with respect to the outside pressure (for example, atmospheric pressure) by the pressure regulating mechanism unit 30. Then, the opening/closing valve 55 provided in the coating solution supply pipe 51 is opened. This introduces the coating solution F into the storage chamber 25 of the coating nozzle 20 via the coating solution supply pipe 51. In this event, the amount of the coating solution F held in the storage chamber 25 only needs to be an amount with which a coating film can be formed at least once or more over the entire surface of the wafer W. After a predetermined amount of the coating solution F is stored in the storage chamber 25, the opening/closing valve 55 is closed. At this time, the pressure of the space S in the storage chamber 25 is held at a predetermined negative pressure state, for example, P0. Note that the replenishment of the coating solution F into the storage chamber 25 may be preliminarily performed before the positions of the coating nozzle 20 and the wafer W are set.

Next, the stage 11 with the wafer W mounted thereon is moved in the X-direction in FIG. 1 to bring the coating nozzle 20 close to the end portion of the wafer W. Then, the pressure regulating mechanism unit 30 increases the pressure of the space S in the storage chamber 25 to a predetermined value P1 higher than the pressure P0. Thus, the coating solution F held in the flow passage 27 and the discharge port 23 by the surface tension of the coating solution F and the negative pressure of the hermetically closed space S is pushed out and adheres to the wafer W, whereby a solution paddle of the coating solution F is formed between the end portion of the wafer W and the discharge port 23. Note that at the time of solution adherence, the coating nozzle 20 may be temporarily further lowered to bring the discharge port 23 into contact with the front surface of the wafer W.

Next, the pressure of the space S is immediately decreased to P2 lower than P1 to prevent the coating solution F from excessively flowing out from the discharge port 23 onto the wafer W. Then, the stage 11 is moved in the X-direction at a predetermined speed to relatively move the coating nozzle 20 from one end side to the other end side of the wafer W so that the coating nozzle 20 scans the top of the wafer W. Thus, the coating solution F is continuously discharged from the discharge port 23 onto the wafer W to form a coating film on the front surface of the wafer W. In this event, the discharge width and the discharge amount of the coating solution F are calculated in real time by the arithmetic processing unit 123 from the result of the alignment processing by the sensor unit 60 and the coordinates of the stage 11 at present. Further, on the basis of the calculation results of the discharge width and the discharge amount of the coating solution F by the arithmetic processing unit 123, the pressure control unit 125 regulates the pressure while changing the pressure of the space S by the pressure regulating mechanism unit 30, in consideration of the lowering of the solution surface of the coating solution F in the storage chamber 25. The process of the pressure regulation will be described later.

After the coating nozzle 20 moves to the other end side of the wafer W, the pressure regulating mechanism unit 30 decreases the pressure of the space S, for example, to P3 lower than P1 to draw the coating solution F, which has not been discharged from the discharge port 23, to the storage chamber 25 side. This separates the coating solution F remaining in the discharge port 23 from the coating solution F applied on the wafer W. Namely, the solution puddle formed between the discharge port 23 and the wafer W is eliminated, and the supply of the coating solution F to the wafer W is stopped.

Next, the pressure of the space S is increased again to, for example, P0, and the coating nozzle 20 is retracted to the predetermined waiting position. Thereafter, the wafer W is transferred out of the treatment container 1 by the not-illustrated transfer apparatus, with which the coating film forming treatment on one wafer W ends.

Figure 6:
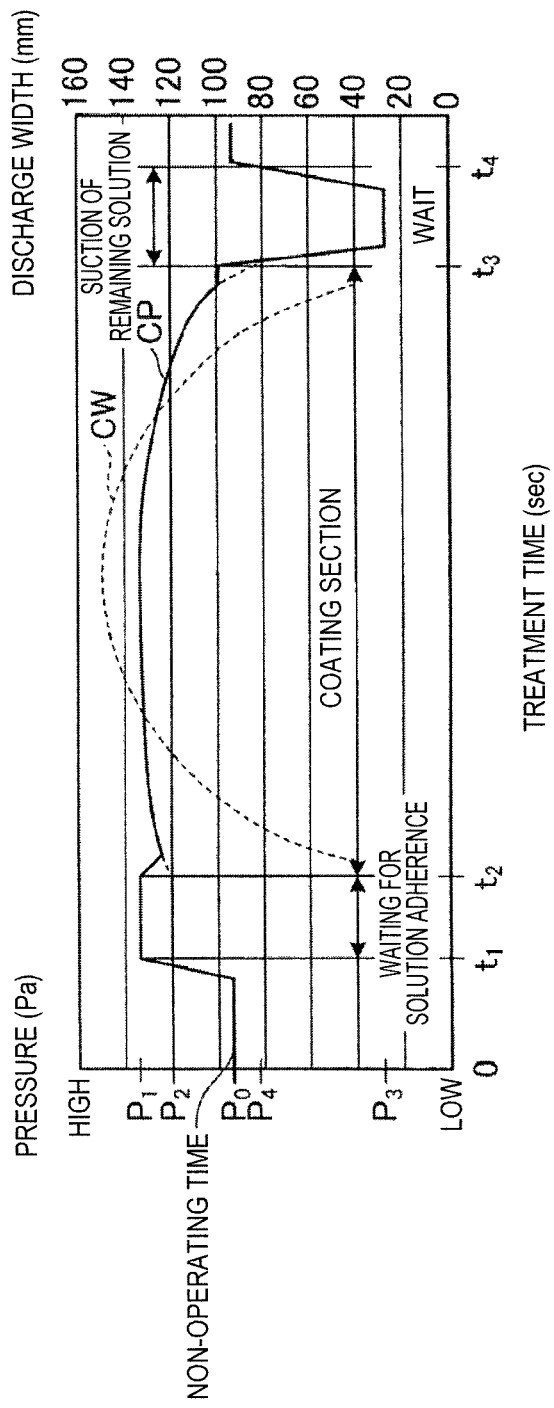
FIG. 6 is a graph illustrating the relationship between a treatment time, and a pressure of a space in a storage chamber and a discharge width of the coating solution, when forming a coating film by the coating film forming apparatus in the embodiment of the present invention.

Here, the control of the pressure in the coating nozzle 20 in the coating step in the case of forming a coating film by the coating film forming apparatus 100 will be described referring to FIG. 6. FIG. 6 is a graph illustrating the relationship between the treatment time (horizontal axis) of the coating step, and the pressure (vertical axis left) of the space S in the storage chamber 25 and the discharge width (vertical axis right) of the coating solution F. In FIG. 6, a curve CP indicates the experimentally obtained pressure change of the space S in the storage chamber 25. As illustrated in FIG. 6, the coating film forming process is performed with the pressure of the space S in the storage chamber 25 kept at a negative pressure state. Accordingly, any of the pressures P0 to P3 indicated in FIG. 6 means a negative pressure state.

On the horizontal axis in FIG. 6, a solution adherence treatment is performed from a time point t1 to a time point t2. As described above, at the time of solution adherence, the pressure of the space S in the storage chamber 25 is increased up to the predetermined value P1 higher than the pressure P0 by the pressure regulating mechanism unit 30. The required time from the time points t1 to t2 for performing the solution adherence treatment can be, for example, several seconds. During the time points t1 to t2, the solution puddle of the coating solution F is formed between the end portion of the wafer W and the discharge port 23 while the stage 11 is not moved but made to stand still.

Next, from the time point t2 to a time point t3, the coating nozzle 20 and the wafer W are relatively moved to perform a coating treatment of discharging the coating solution F to the wafer W to form a coating film. Here, the relative moving speed between the coating nozzle 20 and the wafer W (coating speed) can be set to, for example, several mm/sec. In this embodiment, the coating is performed at a constant coating speed from the time points t2 to t3.

The pressure control in the coating treatment is as follows. First, the pressure of the space S is set once to be decreased to P2 lower than P1 from the time point t2 to prevent the coating solution F from excessively flowing out from the discharge port 23 onto the wafer W as described above. Note that in the curve CP of the pressure in FIG. 6, a broken line portion starting from the time point t2 indicates the change in set pressure. Namely, in the broken line portion, there is a deviation between the set pressure P2 and the actual pressure in the space S.

In the first half of the coating step, the pressure of the space S is increased from the pressure P2 to the pressure P1 so that the pressure follows the change in the shape of the wafer W forming a circle (namely, an increase in the width of the wafer W) until the discharge width of the coating solution F reaches the maximum near the center of the wafer W.

In the second half of the coating step (after the discharge width of the coating solution F reaches the maximum), conversely, the pressure of the space S is gradually decreased from the pressure P1 so that the pressure follows the change in the shape of the wafer W forming a circle (namely, a decrease in the width of the wafer W). Further, the pressure of the space S is set to be decreased to P4 lower than P2 just before reaching the time point t3. The reason why the pressure is decreased down to P4 lower than P2 in the second half of the coating step is to suppress the discharge of the coating solution F because the supply of the coating solution F becomes excessive near the terminal end portion of the wafer W to cause the film thickness of the coating film to tend to be larger than those at other portions. Note that in the curve CP of the pressure in FIG. 6, the broken line portion just before the time point t3 indicates a change in set pressure. Namely, there is a deviation between the set pressure P4 and the actual pressure in the space S at the broken line portion.

After reaching the time point t3 until a time point t4, a solution separation treatment is performed. As described above, at the time of solution separation, the pressure of the space S is decreased, for example, to P3 lower than P0 by the pressure regulating mechanism unit 30. This draws the coating solution F which has not been discharged from the discharge port 23 to the storage chamber 25 side to thereby separate the coating solution F remaining in the discharge port 23 from the coating solution F applied on the wafer W. The required time from the time points t3 to t4 for performing the solution separation treatment can be set, for example, several seconds.

In the coating film forming apparatus 100 of this embodiment, the pressure of the space S in the storage chamber 25 is changed as indicated by the curve CP according to the change in the discharge width of the coating solution F responding to the change in shape of the wafer W indicated by a curve CW during the time points t2 to t3. Namely, the control unit 70 performs the following control. First, during the time points t2 to t3 when the coating nozzle 20 and the wafer W are relatively moved, the arithmetic processing unit 123 calculates in real time the discharge width and the discharge amount of the coating solution F on the basis of the shape information on the wafer W preliminarily inputted and stored in the substrate shape information storage unit 121 and information on the relative position of the wafer W detected by the sensor unit 60 as the position detection means. Then, the pressure control unit 125 controls the pressure regulating mechanism unit 30 on the basis of the discharge width and the discharge amount of the coating solution F calculated by the arithmetic processing unit 123. More specifically, the pressure control unit 125 sends controls signals to the gas supply mechanism section 31 and/or the exhaust mechanism section 41 on the basis of the discharge width and the discharge amount of the coating solution F which are the calculation results, to change the pressure of the space S in the storage chamber 25 according to the discharge width of the coating solution F as illustrated in FIG. 6.

Figure 7:
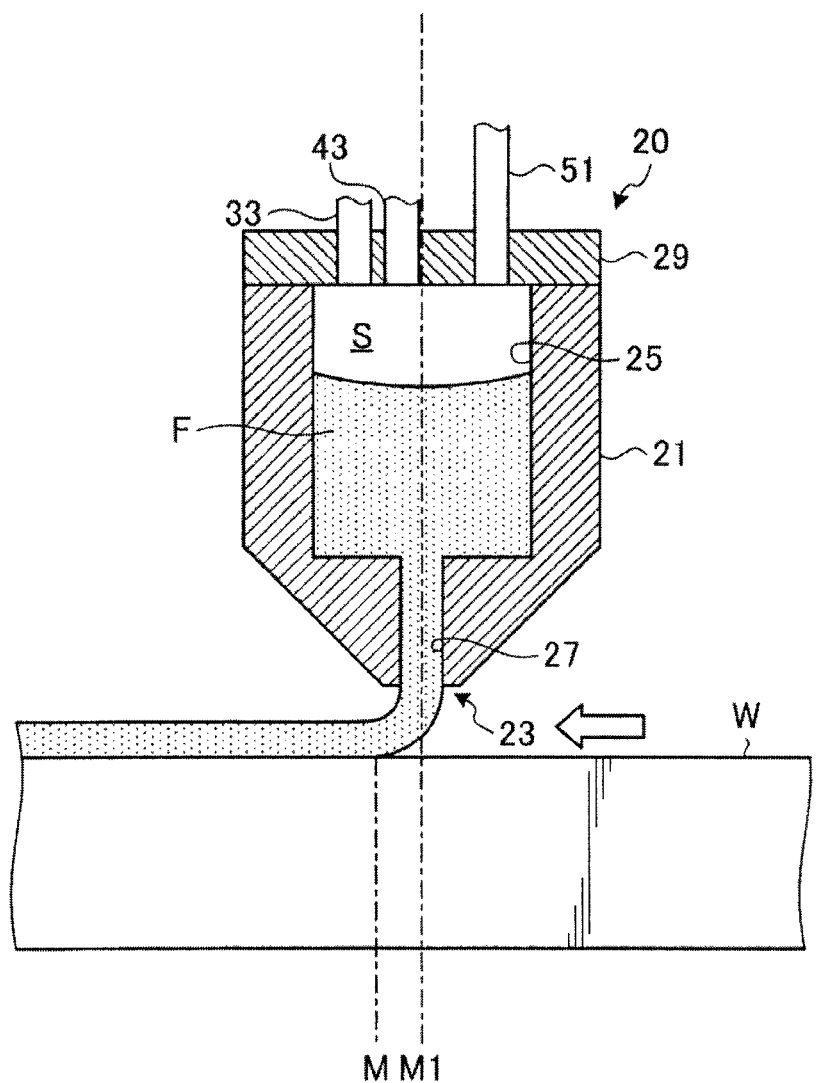
FIG. 7 is an explanatory view indicating a state where the coating solution is being discharged from the coating nozzle.

Next, the principle of the coating film forming method disclosed in this specification will be described referring to FIG. 7 to FIG. 12. First, the relationship between the discharge width of the coating solution F and the position of the discharge port 23 when the coating nozzle 20 discharges the coating solution F will be described referring to FIG. 7. FIG. 7 is an explanatory view indicating the state where the coating solution F is being discharged from the coating nozzle 20. While the coating nozzle 20 and the wafer W are relatively moved at a constant speed, the coating solution F being a viscous fluid is applied on the wafer W in a manner to follow the discharge port 23 with a slight delay therefrom as illustrated in FIG. 7.

Accordingly, for example, assuming that the position of M in FIG. 7 is the position where the width of the wafer W reaches the maximum (the center of the wafer W), the center of the discharge port 23 of the coating nozzle 20 needs to proceed to a position of M1 slightly ahead of M in order to discharge the coating solution F at the position of M. Here, it is clear that the discharge width of the coating solution F becomes maximum at the position of M. Accordingly, there is a slight deviation between the position M where the width of the wafer W becomes maximum and the discharge width becomes maximum and the position M1 of the discharge port 23 of the coating nozzle 20 when performing the coating with the maximum discharge width. From the reason, the position of the coating nozzle 20 is defined on the basis of the discharge width of the coating solution F in this embodiment.

FIG. 8 to FIG. 12 depict the position of the discharge port 23 projected on the wafer W for explaining the positional relationship between the coating nozzle 20 and the wafer W which are relatively moved during the time points t2 to t3. In FIG. 8 to FIG. 12, the moving direction of the wafer W with respect to the discharge port 23 of the coating nozzle 20 at rest is indicated with white arrows.

Figure 8:
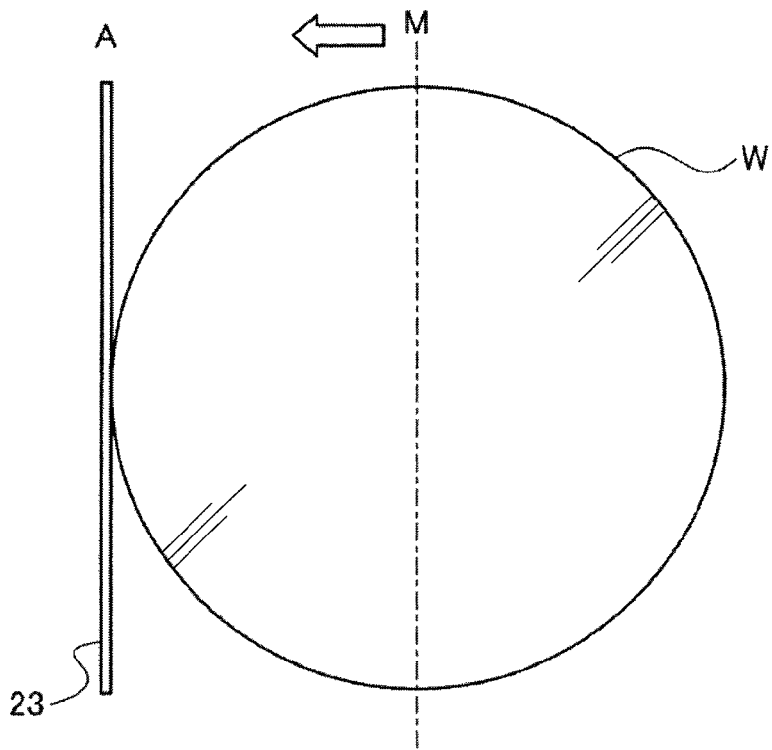
FIG. 8 is a view for explaining the positional relationship between the discharge port of the coating nozzle and the semiconductor wafer which are relatively moved in a process of a coating treatment.
Figure 9:
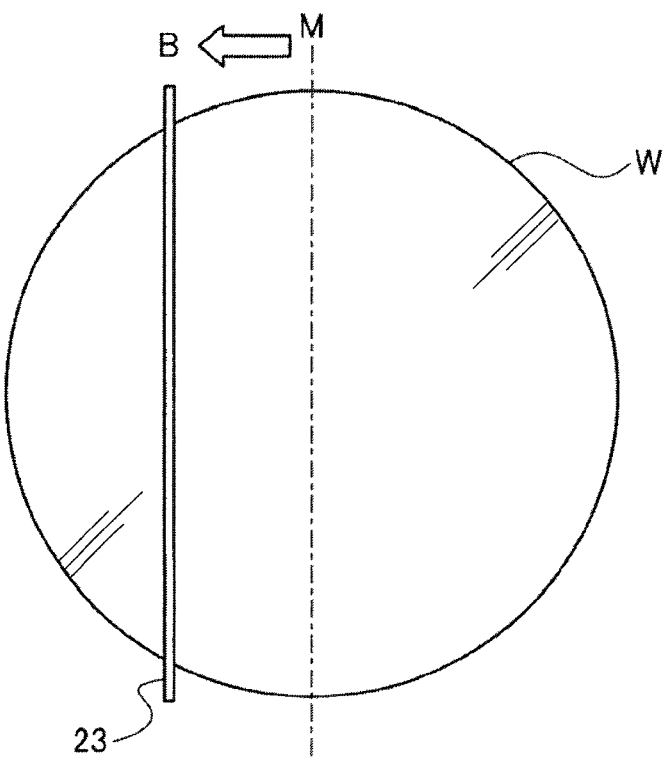
FIG. 9 is a view subsequent to FIG. 8 for explaining the positional relationship between the discharge port of the coating nozzle and the semiconductor wafer which are relatively moved in the process of the coating treatment.
Figure 10:
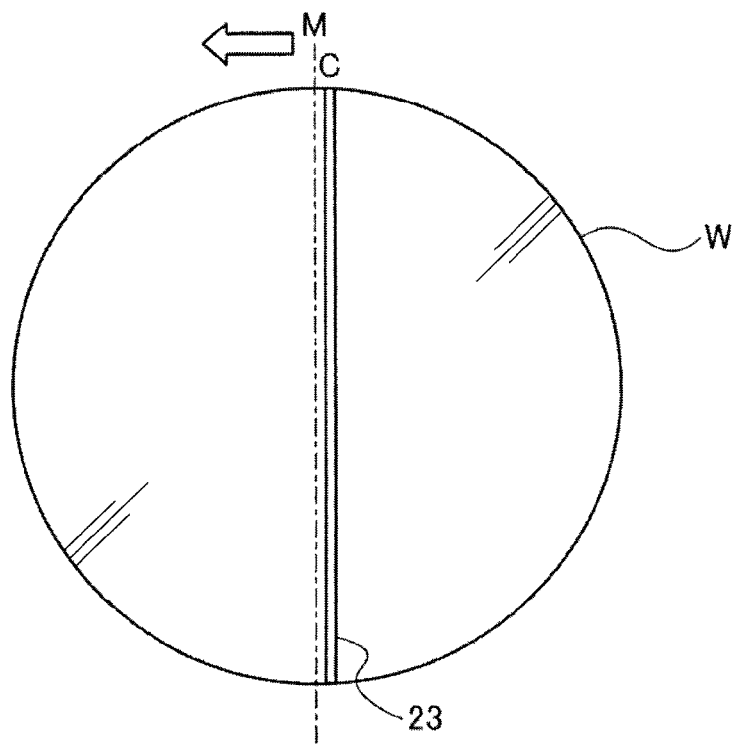
FIG. 10 is a view subsequent to FIG. 9 for explaining the positional relationship between the discharge port of the coating nozzle and the semiconductor wafer which are relatively moved in the process of the coating treatment.

FIG. 8 corresponds to the time point t2 and illustrates a state where the discharge port 23 is located at one end side of the wafer W where the coating is started. FIG. 12 corresponds to the time point t3 and illustrates a state where the discharge port 23 is located at the other end side of the wafer W where the coating is ended. FIG. 9 illustrates a process that the discharge width of the coating solution F increases at the middle of the coating. FIG. 10 indicates the position of the discharge port 23 when the discharge width of the coating solution F becomes maximum with respect to the circular wafer W at the middle of the coating. In FIG. 10, the discharge port 23 is located slightly ahead of the position of M where the width of the wafer W reaches the maximum as explained in FIG. 7. On the other hand, FIG. 11 illustrates a process that the discharge width of the coating solution F decreases at the middle of the coating.

In the above-described coating film forming method, the pressure of the space S in the storage chamber 25 is gradually increased (refer also to FIG. 6) in the first half of the coating, namely, when the discharge port 23 is located at the positions illustrated in FIG. 8 to FIG. 10 with respect to the circular wafer W. In this process, since the discharge width of the coating solution F increases with an increase in the width of the wafer W, the discharge amount per unit time of the coating solution F needs to be increased with the increase in the discharge width. Namely, since the discharge width becomes larger at a position of B in FIG. 9 than at a position of A in FIG. 8, the discharge amount per unit time of the coating solution F needs to be increased. Further, since the discharge width becomes larger at a position of C in FIG. 10 than at the position of B in FIG. 9, the discharge amount per unit time of the coating solution F needs to be increased. To smoothly respond to the increase in the discharge amount per unit time, it is effective to gradually increase the pressure of the space S in the storage chamber 25 to promote the discharge of the coating solution F little by little.

Figure 11:
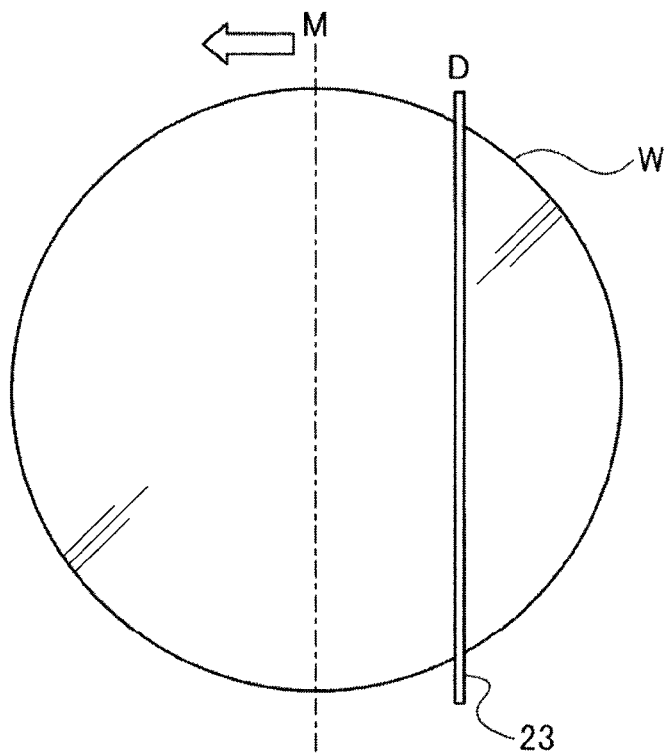
FIG. 11 is a view subsequent to FIG. 10 for explaining the positional relationship between the discharge port of the coating nozzle and the semiconductor wafer which are relatively moved in the process of the coating treatment.
Figure 12:
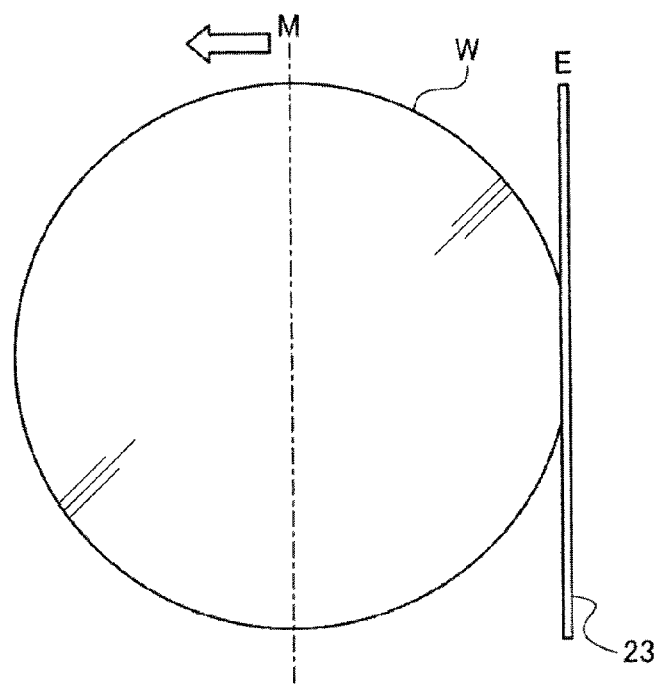
FIG. 12 is a view subsequent to FIG. 11 for explaining the positional relationship between the discharge port of the coating nozzle and the semiconductor wafer which are relatively moved in the process of the coating treatment.

Further, the pressure of the space S in the storage chamber 25 is gradually decreased (refer also to FIG. 6) in the second half of the coating, namely, when the discharge port 23 has passed through the position indicated in FIG. 10 and is located at the positions indicated in FIG. 11 and FIG. 12 with respect to the circular wafer W. In this process, since the discharge width of the coating solution F is decreased with a decrease in the width of the wafer W, the discharge amount per unit time of the coating solution F needs to be decreased with the decrease in the discharge width in order to make the film thickness of the coating film constant. Namely, since the discharge width becomes smaller at a position of D in FIG. 11 than at the position of C in FIG. 10, the discharge amount per unit time of the coating solution F needs to be decreased. Further, since the discharge width becomes smaller at a position of E in FIG. 12 than at the position of D in FIG. 11, the discharge amount per unit time of the coating solution F needs to be decreased. To smoothly respond to the decrease in the discharge amount per unit time, it is effective to gradually decrease the pressure of the space S in the storage chamber 25 to suppress the discharge of the coating solution F little by little.

If it is tried to perform control so as to make the pressure of the space S in the storage chamber 25 constant in the process from FIG. 10 to FIG. 12, the pressure of the space S is increased corresponding to the decrease in pressure with the decrease of the coating solution F. The pressure increase of the space S acts to increase the discharge of the coating solution F, with the result that the film thickness of the coating film tends to increase. In particular, when the pressure of the space S in the storage chamber 25 is controlled to be constant, the supply of the coating solution F becomes excessive near the terminal end portion of the wafer W illustrated at E in FIG. 12 to cause the film thickness of the coating film to become larger than those at the other portions.

Figure 13:
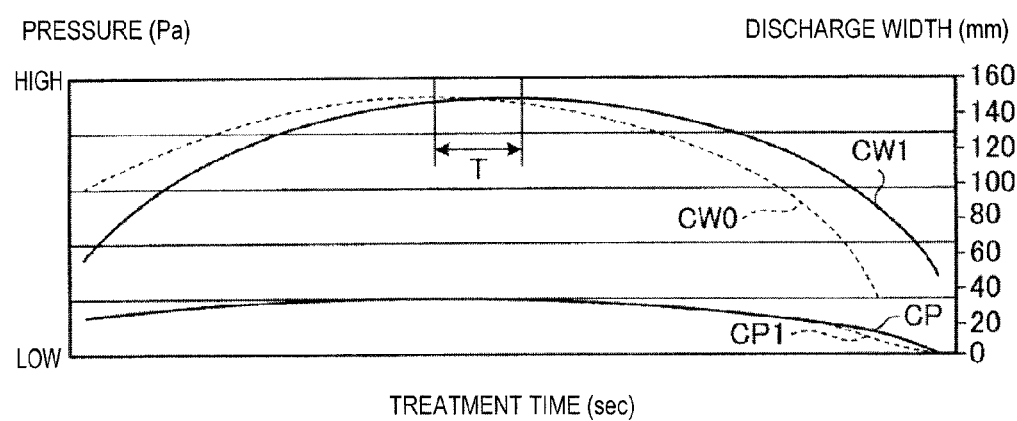
FIG. 13 is a graph illustrating the relationship between the treatment time, and the pressure of the space in the storage chamber and the discharge width of the coating solution, when forming the coating film by the coating film forming apparatus in the embodiment of the present invention.

Next, a method of obtaining an optimum pressure set value for controlling the pressure of the space S in the storage chamber 25 will be described referring to FIG. 13. FIG. 13 is a graph illustrating the relationship between the treatment time (horizontal axis) of the coating step, the pressure (vertical axis left) of the space S in the storage chamber 25 and the discharge width (vertical axis right) of the coating solution F. The regulation of the pressure of the space S inside the storage chamber 25 in the coating nozzle 20 and the change in the discharge amount per unit time of the coating solution F are performed with the behaviors as described in the following (i) to (iii).

(i) When the set value of the pressure of the space S inside the storage chamber 25 is changed, the supply or exhaust of gas to/from the space S is performed by the pressure regulating mechanism unit 30.
(ii) The pressure of the space S changes.
(iii) The solution surface of the coating solution F changes inside the storage chamber 25, and the discharge amount from the discharge port 23 changes. In this event, the resistance in the flow passage 27 also influences the discharge amount.

The change of the set value of the pressure in the above (i) is performed by the pressure control unit 125 sending the control signal to the pressure regulating mechanism unit 30. Here, assuming that the time point when the pressure control unit 125 sends the control signal is T0 and the time point when the discharge amount actually changes through the stage of the above (ii) from the time point T0 is T1, there occurs a time lag T (T=T1−T0) that is the difference between the time points T0 and T1. Here, the time lag T also contains the temporal delay of the coating solution F being a viscous fluid following the discharge port 23 (refer to FIG. 7).

Further, when the coating nozzle 20 and the wafer W are relatively moved at a constant speed V [mm/sec], a position PL1 of the discharge port 23 of the coating nozzle 20 at the time point TI with respect to a position PL0 of the discharge port 23 of the coating nozzle 20 at the time point T0 is PL1=(V×T)+PL0. Accordingly, taking into account the time lag T, the pressure control of the space S by the pressure control unit 125 needs to take, as the base, not the discharge width at the time point T0 and the position PL0 but the discharge width at the time point T1 and the position PL1.

In FIG. 13, a curve CP is the same as the curve CP indicating the pressure change of the space S in the storage chamber 25 illustrated in FIG. 6. Further, the curve CP1 in FIG. 13 indicates an approximated curve of the pressure obtained as a result of calculating the time lag T and a correction pressure reduction degree coefficient g by the binary search so that the standard deviation of the difference with respect to the curve CP becomes minimum. Further, in FIG. 13, a curve CW0 indicates the discharge width at the position PL0, and a curve CW1 indicates the discharge width at the position PL1. Here, the difference between the curve CW0 and the curve CW1 corresponds to the time lag T.

The approximated curve CP1 in FIG. 13 is based on a set pressure value PCP1 calculated by the following expression A. Here, the time lag T is set to several seconds, and the relative moving speed between the coating nozzle 20 and the wafer W is set to several mm/sec.

$$\text{Set pressure value } PCP1 = P\max + (LPL1 - L\max) \times g \quad (A)$$

In the expression, Lmax represents the maximum discharge width [mm], LPL1 represents the discharge width [mm] at the position PL1, Pmax represents the pressure reduction degree [Pa] at the maximum discharge width Lmax, g represents the correction pressure reduction degree coefficient of the difference between the discharge width LPL1 at the position PL1 and the maximum discharge width Lmax.

As illustrated in FIG. 13, the approximated curve CP1 obtained by the expression A substantially overlaps with the experimentally obtained curve CP. From the fact, it is possible to obtain the optimum set pressure value of the space S inside the storage chamber 25 in the coating nozzle 20 by utilizing the expression A.

As described above, the coating film forming apparatus 100 and the coating film forming method can achieve an effect capable of forming a uniform coating film on a substrate such as a wafer W in a shape changing in width in the coating film formation by the slit-coat method.

An embodiment of the present invention has been described above in detail for exemplification, but the present invention is not limited to the above embodiment but can be variously modified. For example, though the coating nozzle 20 and the wafer W are relatively moved by moving the wafer W with respect to the coating nozzle 20 at rest in the above embodiment, the coating nozzle 20 may be moved in the horizontal direction with the position of the wafer W fixed for instance.

Further, though the circular semiconductor wafer is taken as an example of the substrate in the above embodiment, the treatment object is not limited to the semiconductor wafer as long as the substrate changes in width, and its shape is not limited to a circle.

A preferred embodiment of the present invention has been described above with reference to the accompanying drawings, but the present invention is not limited to the embodiment. It should be understood that various changes and modifications are readily apparent to those skilled in the art within the scope of the spirit as set forth in claims, and those should also be covered by the technical scope of the present invention.

What is claimed is:

1. A coating film forming apparatus for forming a coating film on a substrate, comprising:
    a coating nozzle that supplies a coating solution toward the substrate;
    a horizontal moving mechanism unit that relatively moves the substrate and the coating nozzle in a horizontal direction;
    a pressure regulating mechanism unit that regulates a pressure inside the coating nozzle; and
    a control unit that performs control to change an amount of the coating solution to be supplied from the coating nozzle toward the substrate,
    wherein the substrate forms a shape changing in width in a direction perpendicular to a direction of the relative movement,
    wherein the coating nozzle comprises:
        a discharge port that is formed long in a direction perpendicular to the direction of the relative movement with respect to the substrate and discharges the coating solution toward the substrate; and
        a storage chamber that communicates with the discharge port and stores the coating solution therein,
    wherein the pressure regulating mechanism unit regulates a pressure of a space inside the storage chamber, and
    wherein the control unit controls, while the coating solution is applied to the substrate, the pressure regulating mechanism unit, according to a discharge width of the coating solution to be discharged from the discharge port changing responding to a change in width of the substrate, to regulate the pressure inside the storage chamber to thereby change a discharge amount per unit time of the coating solution to be discharged from the discharge port,
    further comprising:
    a position detection means that detects relative positions of the coating nozzle and the substrate,
    wherein the control unit comprises:
        a substrate shape information storage unit that stores shape information on the substrate;
        an arithmetic processing unit that calculates the discharge width and the discharge amount of the coating solution on a basis of the shape information on the substrate stored in the substrate shape information storage unit and information on the relative position of the substrate detected by the position detection means; and
        a pressure control unit that controls the pressure regulating mechanism unit on a basis of the discharge width and the discharge amount of the coating solution calculated by the arithmetic processing unit.

2. The coating film forming apparatus according to claim 1, wherein the control unit is configured to control the pressure regulating mechanism unit to gradually increase the pressure inside the storage chamber in a process of the discharge width of the coating solution increasing, and gradually decrease the pressure inside the storage chamber in a process of the discharge width of the coating solution decreasing.

3. The coating film forming apparatus according to claim 1, wherein the substrate is circular, and
wherein the control unit is configured to control the pressure regulating mechanism unit to gradually increase the pressure inside the storage chamber until the discharge width of the coating solution reaches a diameter of the substrate, and gradually decrease the pressure inside the storage chamber after the discharge width of the coating solution reaches the diameter of the substrate.

4. The coating film forming apparatus according to claim 1, wherein the control unit is configured to control, while the coating solution is applied to the substrate, the pressure regulating mechanism unit to keep the pressure inside the storage chamber at a negative pressure with respect to a pressure outside the storage chamber.

5. The coating film forming apparatus according to claim 1, wherein the substrate is circular, and
wherein assuming that a time point when the pressure control unit sends a control signal is $T0$ and a time point when the discharge amount actually changes from the time point $T0$ is $T1$, there is a time lag $T$ that is a difference between the time points $T0$ and $T1$, and when the coating nozzle and the substrate are relatively moved at a constant speed V and a position $PL1$ of the discharge port at the time point $T1$ with respect to a position $P0$ of the discharge port at the time point $T0$ is $PL1 = (V \times T) + PL0$, a set pressure value inside the storage chamber is calculated based on a following expression A, $$\text{set pressure value} = P\text{max} + (LPL1 - L\text{max}) \times g \quad (A)$$

where Lmax represents a maximum discharge width [mm], LPL1 represents a discharge width [mm] at the position PL1, Pmax represents a pressure reduction degree [Pa] at the maximum discharge width Lmax, g represents a correction pressure reduction degree coefficient of the difference between the discharge width LPL1 at the position PL1 and the maximum discharge width Lmax.

* * * * *